US007200239B2

(12) United States Patent
Yabe et al.

(10) Patent No.: US 7,200,239 B2

(45) Date of Patent: Apr. 3, 2007

(54) ACOUSTIC APPARATUS HAVING BALANCE ADJUSTMENT

(75) Inventors: Kazuo Yabe, Kawagoe (JP); Hideshi Ishiyama, Kawagoe (JP); Takahiro Ushiba, Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 0 days.

(21) Appl. No.: 10/021,436

(22) Filed: Dec. 19, 2001

(65) Prior Publication Data

US 2002/0076066 A1 Jun. 20, 2002

(30) Foreign Application Priority Data

Dec. 20, 2000 (JP) ............................ 2000-386218

(51) Int. Cl.
*H03G 3/00* (2006.01)
*H04B 1/00* (2006.01)

(52) U.S. Cl. ......................... 381/107; 381/86; 381/104

(58) Field of Classification Search .................. 381/86, 381/104, 105, 106, 107, 108, 109, 18, 19, 381/307; 340/692; 379/102.03; 369/4, 369/5; 455/345, 569.2, 3.06; 725/32, 34
See application file for complete search history.

(56) References Cited

U.S. PATENT DOCUMENTS 5,185,803 A * 2/1993 Moyski et al. ................ 381/86
5,661,811 A * 8/1997 Huemann .................... 381/86
5,692,058 A * 11/1997 Eggers et al. ............... 381/107
5,910,996 A * 6/1999 Eggers et al. ............... 381/107
6,154,649 A 11/2000 Reichstein
6,330,337 B1 * 12/2001 Nicholson et al. ............ 381/86
6,674,865 B1 * 1/2004 Venkatesh et al. .......... 381/107

FOREIGN PATENT DOCUMENTS

| | | | |
|---|---|---|---|
| DE | 196 19 815 | | 11/1997 |
| EP | 0 387 516 | | 9/1990 |
| EP | 0 691 736 | | 1/1996 |
| JP | 04162900 | A * | 6/1992 |
| JP | 9-9397 | | 1/1997 |

OTHER PUBLICATIONS

EP Search Report, dated Nov. 2006.

* cited by examiner

*Primary Examiner*—Sinh Tran
*Assistant Examiner*—Daniel R. Sellers
(74) *Attorney, Agent, or Firm*—Nixon & Vanderhye PC

(57) ABSTRACT

In an acoustic apparatus, one or more front and rear speakers are provided in a space such as a car compartment. The volume levels of the audio signals output from the speakers are controlled by the volume control unit. Also, the valance between the volume levels of the audio signals from the front speaker and the rear speaker is controlled by the balance control unit. The balance control unit generally controls the balance according to the input by a user. To the front speaker or the rear speaker, an external audio signal can be supplied. When the external audio signal is supplied to one of the front speaker and the second speaker which has not been attenuated by the balance control device and the balance control device attenuates the volume level of said one of the front speaker and the second speaker, the volume level of the audio signal is attenuated. Therefore, the external audio signal becomes easy for the user to hear.

9 Claims, 6 Drawing Sheets

ACOUSTIC APPARATUS HAVING BALANCE ADJUSTMENT

FIELD OF THE INVENTION

The present invention relates to an acoustic apparatus including front speakers disposed at the front side in a room and rear speakers disposed at the rear side, and more particularly to an acoustic apparatus capable of adjusting the balance of the volume levels of audio signals outputted from the front speakers and the rear speakers.

DESCRIPTION OF RELATED ART

As a conventional acoustic apparatus including front speakers disposed at the front side in a room and rear speakers disposed at the rear side, for example, a car-mount acoustic apparatus installed in a car compartment is known. This car-mount acoustic apparatus has a main volume controller function for adjusting the volume level of the audio signals, and a fader function for adjusting the balance of volume levels of audio signals outputted from the front speakers and the rear speakers. By the main volume controller function and the fader function, a sound field full of sensation of presence can be created in the car compartment.

The fader function has the characteristics as shown in FIG. 6. When the sound image (phantom) created by the output audio signals is localized at the center of the compartment, the volume level of the front speakers and the volume level of the rear speakers are equal to the volume level of the main volume controller (indicated by X in FIG. 6). From this state, when the user manipulates the fader control button or the like provided on the operation panel so as to localize the sound image created by the output audio signals at the front side, the volume level of the front speakers (shown in FIG. 6 as a solid line 100) keeps the volume level of the main volume controller, and only the volume level of the rear speakers (shown in FIG. 6 as a broken line 102) is attenuated (in FIG. 6, shown in the right side region of the dotted vertical line Y). On the other hand, when the user manipulates the fader control button or the like provided on the operation panel so as to localize the sound image created by the output audio signals at the rear side, the volume level of the rear speakers keeps the volume level of the main volume controller, and only the volume level of the front speakers is attenuated (in FIG. 6, shown in left side region of the dotted vertical line Y).

Further, by connecting an external device such as a navigation system or a FM receiving system to the front speakers or rear speakers of this car-mount acoustic apparatus, the audio signal from the external device can also be reproduced from the speakers together with the main audio signals. In that case, when the external audio signal is supplied from the external device, the fader function is automatically balanced by the control of a microcomputer or the like.

For example, in the state where the sound image created by the output audio signals is localized at the front side by the manipulation of the fader control button by the user, when the external audio signal is supplied to the front speakers from the external device, the volume level of the main audio signal output from the front speakers is automatically attenuated to the minimum level by the control of the microcomputer or the like. At this time, the volume level of the rear speakers, which has been attenuated by the specified amount, is set to the volume level of the main volume controller.

This volume level changing state is shown in FIG. 7. As shown in FIG. 7, in the state where the sound image created by the output audio signals is localized at the front side by the manipulation of the fader control button by the user, the volume level of the rear speaker (shown by the broken line 108) is attenuated by a specified amount from the main volume controller level (shown by the solid line 104). At this time, the volume level of the front speaker (shown by the solid line 106) is equal to the volume level of the main volume controller as shown in the left side region of the dotted vertical line Z.

In this state, when the external audio signal is supplied to the front speakers from the external device, by control of microcomputer or the like, first, the volume level 108 of the rear speaker, which has been attenuated by a specified amount, is set to the volume level of the main volume controller so as to localize the sound image created by the audio signals at the center Then, the volume level of the front speakers is attenuated to the minimum level, and therefore the sound image created by the audio signals is shifted to the rear side. Thus, when the volume level of front speaker is attenuated to the minimum level, the volume level of the rear speakers is equal to the volume level of the main volume controller, as shown in the right side region of the dotted vertical line Z in FIG. 7.

In the state where the sound image created by the output audio signals is localized at the front side, the user seated in the car compartment feels that the audio sound comes from front side. In this state, when the external audio signal from the external device is supplied to the front speakers as interrupt information, first, the volume level of the rear speakers is set to the volume level of the main volume controller. However, since the sound image which has been localized at the front side is moved to the center, the listening sense of the user is also attracted to the center.

Then, when the volume level of the front speakers is attenuated to the minimum level, the sound image is moved from the center to the rear side, and the listening sense of the user is also drawn the center to the rear side, As a result, when the volume level of the front speakers becomes the minimum level, since the listening sense of the user has been already attracted to the rear side. Therefore, at the time of listening to the audio information from the external device, the listening sense of the user is stronger at the rear side. That is, at the time of listening to the audio information of the external device output from the front speakers, if the listening sense is stronger at the rear side, the user may fail to catch or improperly recognize the external audio information output from the front speakers, and hence the external audio information may be heard incorrectly.

SUMMARY OF THE INVENTION

The present invention is devised to solve such a problem, and it is hence an object thereof to provide an acoustic apparatus capable of minimizing loss of user's listening sense even if the sound image created by the output audio signals is moved when the sound information from the external device is reproduced by interruption, and thereby enabling the user to catch the external audio information correctly.

According to one aspect of the present invention, there is provided an acoustic apparatus including: one or more front speaker disposed at front side in a space for outputting a first audio signal; one or more rear speaker disposed at rear side in the space for outputting a second audio signal; a volume control device for controlling volume level of the first audio signal and the second audio signal; a balance control device for controlling balance between the volume levels of the first audio signal and the second audio signal by attenuating the volume levels of the first audio signal and the second audio signal; an external signal supplying device for supplying an external audio signal to either one of the front speaker and the second speaker; and a control device for controlling the volume control device to attenuate the volume level of the audio signal when the external audio signal is supplied to one of the front speaker and the second speaker which has not been attenuated by the balance control device and the balance control device attenuates the volume level of said one of the front speaker and the second speaker.

In accordance with the acoustic apparatus thus configured, one or more front and rear speakers are provided in a space such as a car compartment. The volume Levels of the audio signals output from the speakers are controlled by the volume control unit. Also, the balance between the volume levels of the audio signals from the front speaker and the rear speaker is controlled by the balance control unit. The balance control unit generally controls the balance according to the input by a user. To the front speaker or the rear speaker, an external audio signal can be supplied. When the external audio signal is supplied to one of the front speaker and the second speaker which has not been attenuated by the balance control device and the balance control device attenuates the volume level of said one of the front speaker and the second speaker, the volume level of the audio signal is attenuated. Therefore, the external audio signal become easy for the user to hear.

In an embodiment, the control device may control the volume control device to attenuate the volume level of the audio signal to a minimum level. For example, the minimum level may be a zero level. Thus, the external audio signal becomes easier to hear.

The acoustic apparatus may further include a mute Instruction unit for detecting a mute instruction inputted by a user, and the volume control device may attenuate the volume level of the audio signal when the mute instruction is detected by the mute instruction unit. In this case, the volume level of the audio signal from the speaker, to which the external audio signal is supplied, is attenuated only when the user inputs the mute instruction.

In a preferred embodiment, the volume control device may set the volume levels of the first audio signal and the second audio signal to the volume levels before the external audio signal is supplied, when supply of the external audio signal ends. Thus, when the supplied of the external audio signal ends, the volume level of the audios signals output from the speakers is restored In an example, the control device may include a storage unit for storing the volume levels of the first audio signal and the second audio signal before the external audio signal is inputted; a readout unit for reading out the volume levels stored in the storage unit when the supply of the external audio signal ends; and a changing unit for changing the volume levels of the first audio signal and the second audio signal to be the volume levels readout by the readout unit.

In a preferred example, the control device may detect a supply of the external audio signal by receiving a signal indicating the supply of the external audio signal from the external signal supplying device. In an alternative example, the control device may detect a supply of the external audio signal by monitoring the external audio signal supplied to the speaker.

The nature, utility, and further features of this invention will be more clearly apparent from the following detailed description with respect to preferred embodiment of the invention when read in conjunction with the accompanying drawings briefly described below.

DETAILED DESCRIPTION OF THE PREFERRED EMBODIMENT

Figure 1:
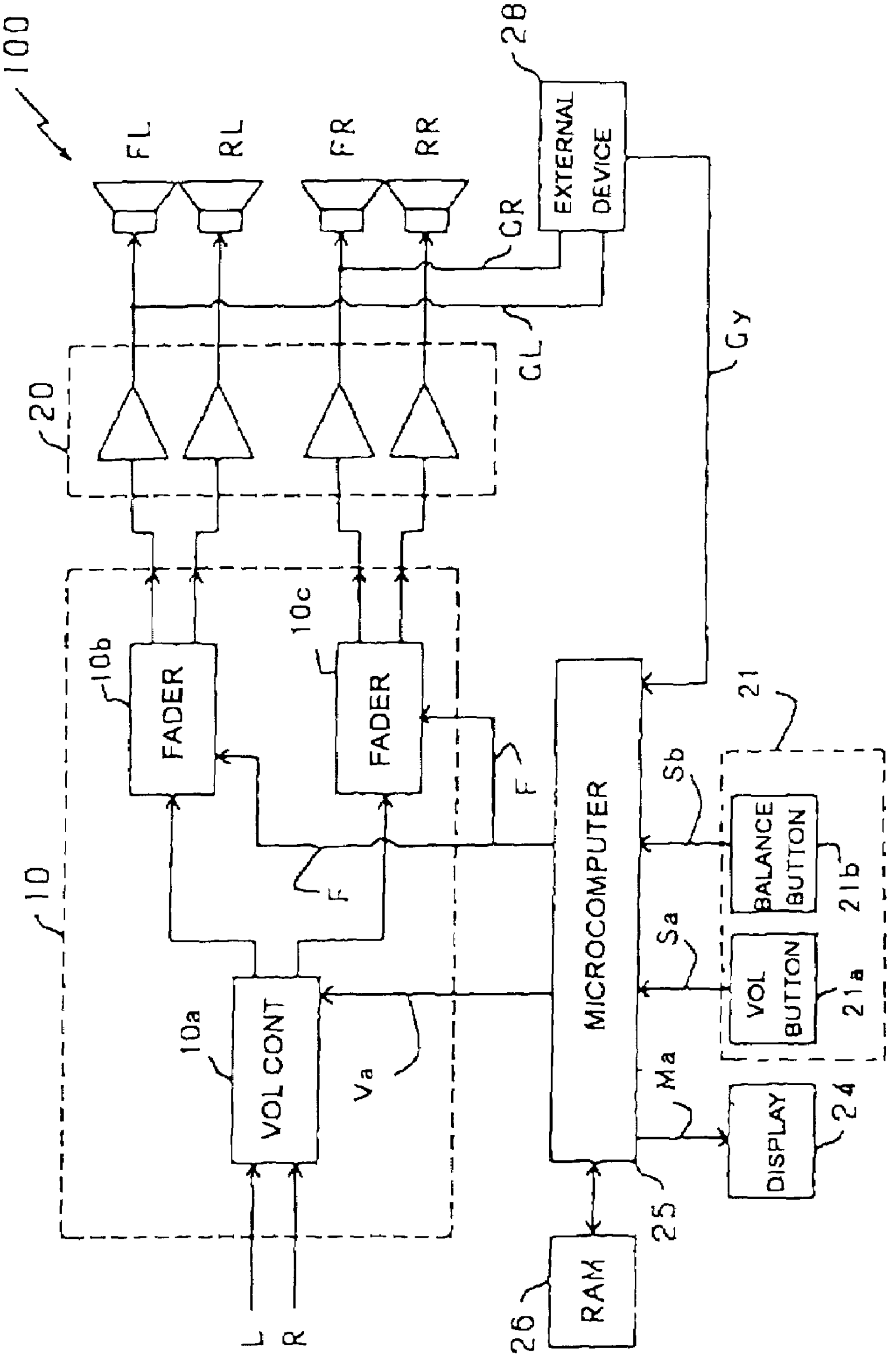
FIG. 1 is a block diagram of a car-mount acoustic apparatus according to an embodiment of the present invention.

Referring now to the drawings, a preferred embodiment of the invention is described below. This embodiment of the invention relates to a car-mount acoustic apparatus installed in a car compartment.

Figure 2:
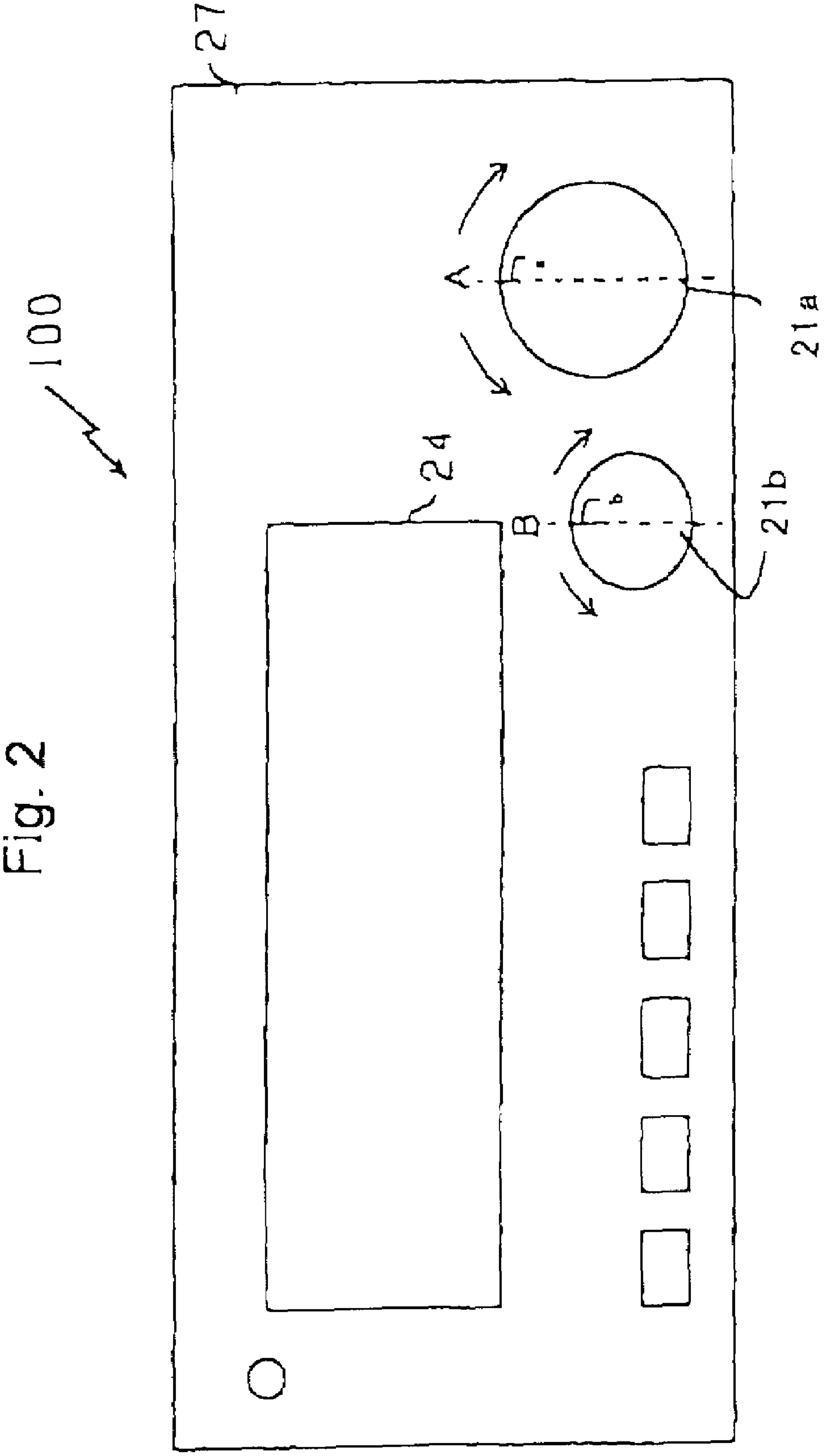
FIG. 2 shows an external appearance of an operation panel of the car-mount acoustic apparatus according to the embodiment.
Figure 3:
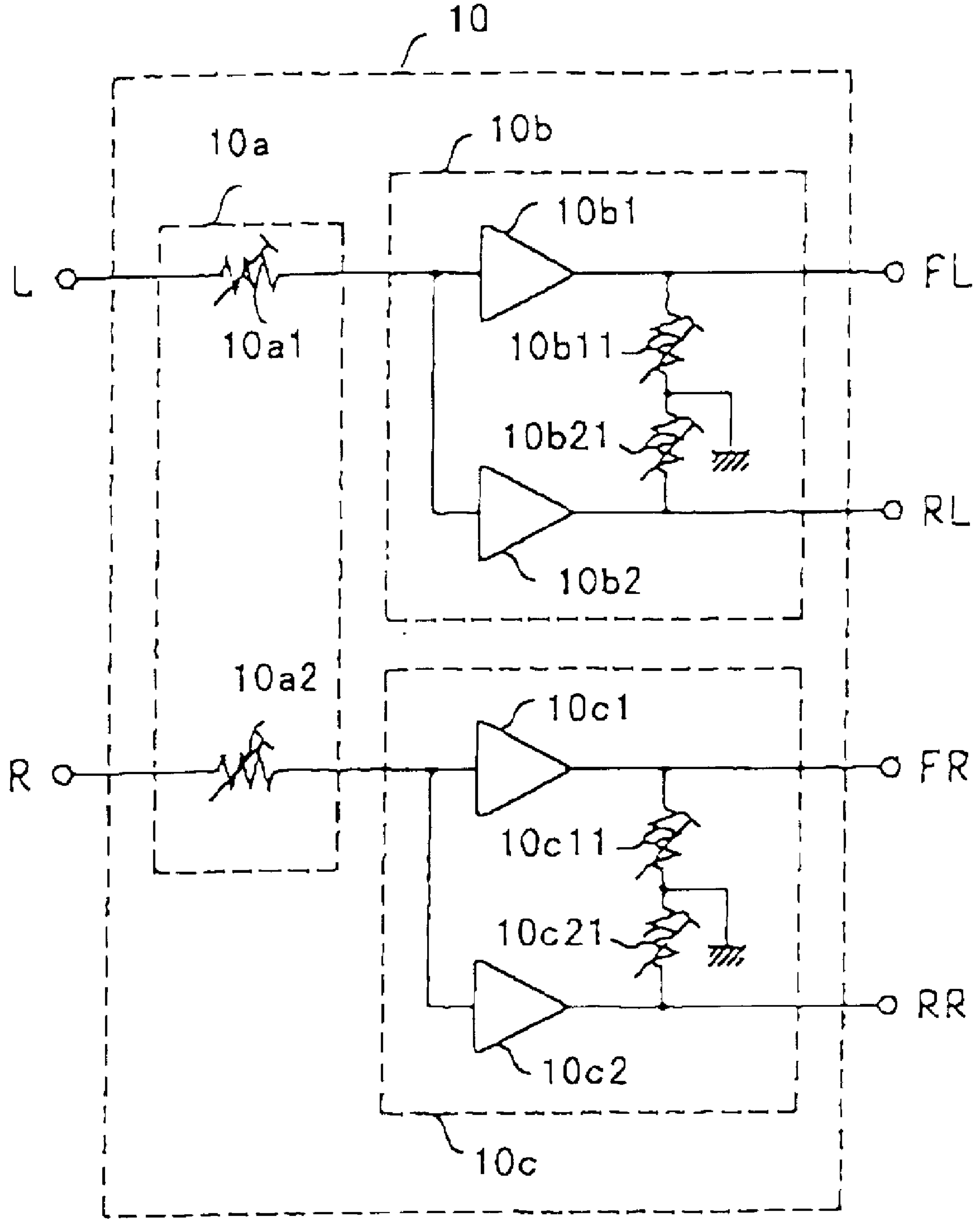
FIG. 3 is a circuit diagram of an electronic volume controller used in the car-mount acoustic apparatus of the embodiment.

First, the configuration and outline of operation of car-mount acoustic apparatus 100 of the embodiment are explained by referring to FIG. 1 to FIG. 3. FIG. 1 is a circuit block diagram of the car-mount acoustic apparatus 100, and FIG. 2 shows an external appearance of an operation panel of the car-mount acoustic apparatus 100. Further, FIG. 3 is an equivalent circuit diagram of an electronic volume controller 10 used in the car-mount acoustic apparatus 100.

The car-mount acoustic apparatus 100 includes the electronic volume controller 10, a power amplifier 20 for amplifying the audio signals of L channel and R channel, a front speaker FL disposed at the front left side in the car compartment, a rear speaker RL disposed at the rear left side, a front speaker FR disposed at the front right side, a rear speaker RR disposed at the rear right side, an operation unit 21, a display unit 24, a microcomputer 25 responsible for control of the entire apparatus, and an RAM 26.

The electronic volume controller 10 has a volume control unit 10*a* for controlling and delivering the volume level (main volume level) of audio signals of L channel and R channel, and faders 10*b* and 10*c*. The fader 10*b* uniformly distributes the audio signals of L channel supplied from the volume control unit 10*a*, supplies the audio signals to the front speaker FL and rear speaker RL disposed at the left side in the compartment, and attenuates the volume level of the audio signals as required. The fader 10*c* uniformly distributes the audio signals of R channel supplied from the volume control unit 10*a*, supplies the audio signals to the front speaker FR and rear speaker RR disposed at the right side in the compartment, and attenuates the volume level of the audio signals as required.

The operation unit 21 has a volume control button 21*a* manipulated for controlling the main volume level, and a balance control button 21*b* which is manipulated by the user for controlling the balance of volume level of the audio signals supplied to the front speakers FL, FR (volume level of front speakers) and the volume level of audio signals supplied to the rear speakers RL, RR (volume level of rear speakers). The volume control button 21*a* supplies an electric signal Sa indicating the volume level depending on the amount of manipulation of the button to the microcomputer 25. The balance control button 21*b* supplies an electric signal Sb indicating the attenuation amount depending on the amount of manipulation of the button to the microcomputer 25.

The microcomputer 25 receives the electric signal Sa or a supply signal Gy explained below, and supplies a control signal Va to the volume control unit 10*a*. The microcomputer 25 receives the electric signal Sb or the supply signal Gy, and supplies a control signal F to the fader 10*b* and the fader 10*c*.

The display unit 24 displays the numerical values indicating the volume level and the attenuation amount depending on the amount of manipulation when each control button of the operation unit 21 is manipulated, and the RAM 26 stores the data showing the volume level and the attenuation amount.

To the front speakers FL and FR of the car-mount electronic apparatus 100, an external device 28 such as a navigation system is connected through cables or connection lines, and the sound signals GL and GR output from the external device 28 are delivered to the speakers and reproduced.

The external device 28 is also connected to the microcomputer 25 of the car-mount electronic apparatus 100, and supplies the supply signal Gy indicating that the external audio signal GL and the external audio signal GR are supplied to the front speakers FL and FR, respectively, to the microcomputer 25.

Next, the function of the operation unit 21 and display unit 24 of the car-mount electronic apparatus 100 is explained. As shown in FIG. 2, a volume control button 21*a*, a balance control button 21*b*, and the display unit 24 are provided on an operation panel 27 of the car-mount electronic apparatus 100.

The volume control button 21*a* is a revolving button. As shown in FIG. 2, when the volume control button 21*a* is turned clockwise from the neutral state in which its terminal (a) is positioned on the dotted center line A, the main volume level is increased, and when turned counterclockwise, the main volume level is attenuated. When the terminal (a) of the volume control button 21*a* at the neutral position, i.e., is positioned on the center line A, the main volume level is at the predetermined reference level.

The balance control button 21*b* is also a revolving button. As shown in FIG. 2, when the balance control button 21*b* is turned clockwise from the neutral state in which its terminal (b) is positioned on the dotted center line B, the sound image created by the output audio signals is localized at the front side. That is, the volume level of the front speakers is not attenuated, and the volume level of the rear speakers is attenuated depending on the revolved amount of the balance control button 21*b*. When the balance control button 21*b* is turned counterclockwise from the neutral state in which its terminal (b) is positioned on the dotted center line B, the sound image created by the output audio signals is localized at the rear side. That is, the volume level of the rear speakers is not attenuated, and the volume level of the front speakers is attenuated depending on the revolving amount of the balance control button 21*b* When the terminal (b) of the balance control button 21*b* is at the neutral position, i.e., is positioned on the dotted center line B, the sound image created by the output audio signals is localized at the center. At this time, the volume level of the front speakers and the volume level of the rear speakers are at the same volume level, that is, both are equal to the main volume level.

The display unit 24 displays the numerical value showing the main volume level in gradual steps, according to the display data Ma from the microcomputer 25, in accordance with the amount of manipulation when the volume control button 21*a* is turned by the user. When the balance control button 21*b* is turned by the user, the display unit 24 displays the numerical value showing the attenuation amount of the volume level of the front speakers or the numerical value showing the attenuation amount of the audio level of the rear speakers, in gradual steps depending on the amount of manipulation.

In such configuration, the user can set a desired main volume level while visually checking the numerical values shown on the display unit 24, and can also control the volume balance by setting the desired attenuation amount of volume level of the front speakers or attenuation amount of volume level of the rear speakers.

Referring next to FIG. 3, the internal structure of the volume control unit 10*a*, the fader 10*b* and the fader 10*c* in the electronic volume controller 10 is explained.

The volume control unit 10*a* has two variable resistors 10*a*1 and 10*a*2. The two variable resistors 10*a*1 and 10*a*2 vary the resistance values simultaneously by a same amount according to the control signal Va supplied from the microcomputer 25, so that the main volume level can be varied. The varied audio signals of L channel and R channel are supplied to the fader 10*b* and the fader 10*c*.

The fader 10*b* has two buffer amplifiers 10*b*1 and 10*b*2, and two variable resistors 10*b*11 and 10*b*21. One terminal of the each of variable resistors 10*b*11 and 10*b*21 is connected to the output side of one of the two buffer amplifiers 10*b*1 and 10*b*2, and the other terminal is connected to the earth potential Similarly to the fader 10*b*, the fader 10*c* has two buffer amplifiers 10*c*1 and 10*c*2, and two variable resistors 10*c*11 and 10*c*21. One terminal of two variable resistors 10*c*11 and 10*c*21 is connected to the output side of one of the buffer amplifiers 10*c*1 and 10*c*2, and the other terminal is connected to the earth potential.

When the balance control button 21*b* is turned counterclockwise from its neutral position, the variable resistor 10*b*11 of fader 10*b* and the variable resistor 10*c*11 of fader 10*c* simultaneously change the resistance values by the same amount according to a control signal F supplied from the microcomputer 25. Each fader supplies such variably attenuated audio signals of L channel and R channel to the front speakers FL and FR. When the balance control button 21*b* is turned clockwise from its neutral position, the variable resistor 10*b*21 of fader 10*b* and the variable resistor 10*c*21 of fader 10*c* simultaneously change the resistance values by the same amount according to a control signal F supplied from the microcomputer 25 Each fader supplies such variably attenuated audio signal of L channel and R channel to the rear speakers RL and RR.

In the case where the resistance values of the variable resistor 10*b*11 of fader 10*b* and the variable resistor 10*c*11 of fader 10*c* are varied to attenuate the volume level of the front speakers, if the balance control button 21*b* is revolved to the neutral position, each variable resistor varies each resistance value to the value corresponding to the main volume level according to a control signal F supplied from the microcomputer 25 Similarly, in the case where the resistance values of the variable resistor 10*b*21 of the fader 10*b* and variable resistor 10*c*21 of the fader B 10*c* are varied to attenuate the volume level of the rear speakers, if the balance control button 21*b* is revolved to the neutral position, each variable resistor varies each resistance value to the value corresponding to the main volume level according to a control signal F supplied from the microcomputer 25.

The fader 10*b* and the fader 10*c* are automatically controlled by the microcomputer 25 to attenuate the volume level of the front speakers to a minimum level (for example, level 0) if the supply signal Gy is supplied from the external device 28 in a state where the volume level of the rear speakers are attenuated by a specified amount by the manipulation of the balance control button 21 by the user.

When receiving the control signal F from the microcomputer 25, the fader 10*b* and the fader 10*c* vary the resistance values of the variable resistors 10*b*21 and 10*c*21 from the value corresponding to the volume level of the rear speakers at that time to the value corresponding to the main volume level Subsequently, the resistance values of the variable resistors 10*b*11 and 10*c*11 are varied from the value corresponding to the main volume level to the value corresponding to the minimum level.

Figure 4:
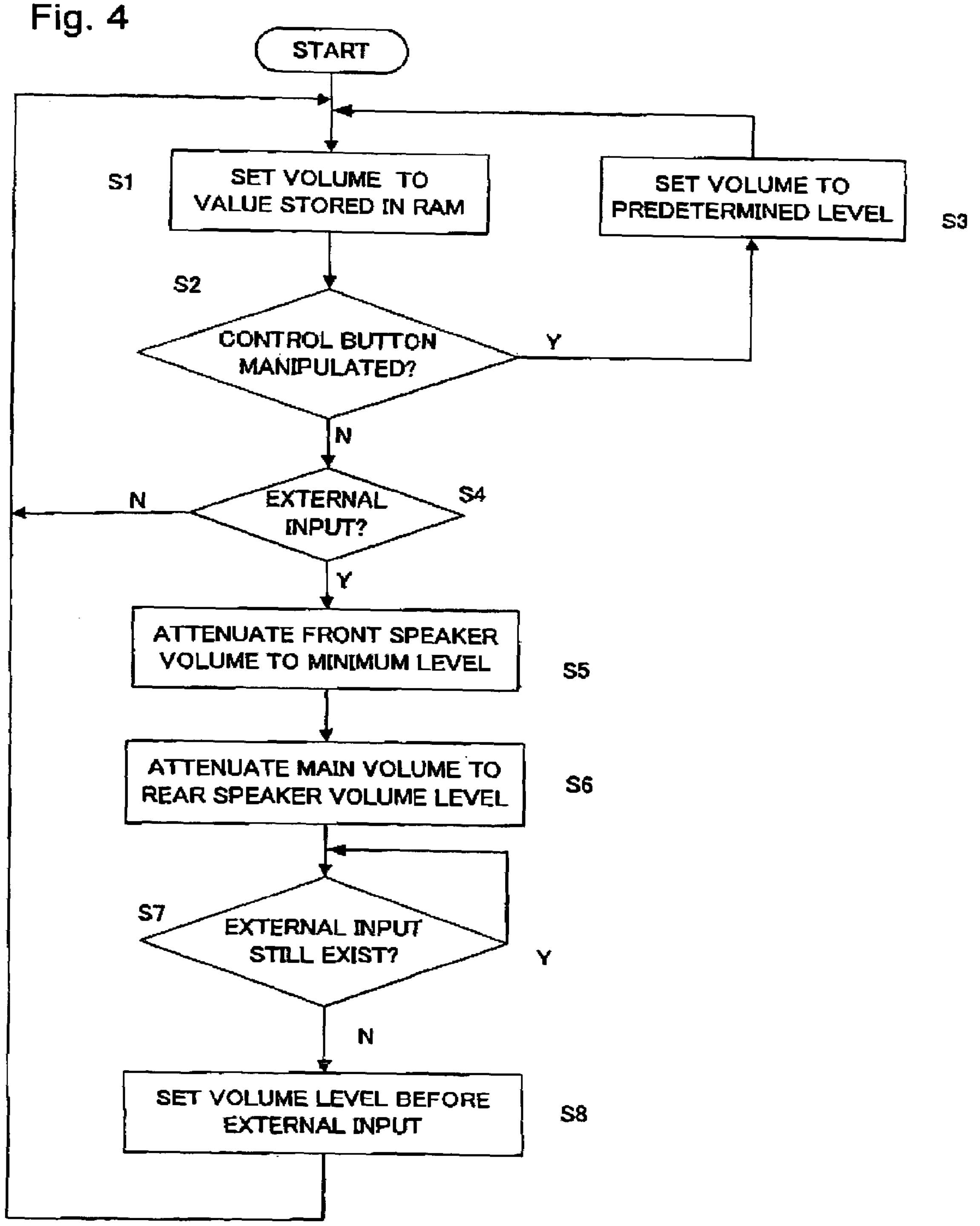
FIG. 4 is an operation flowchart of the car-mount acoustic apparatus of the embodiment.
Figure 5:
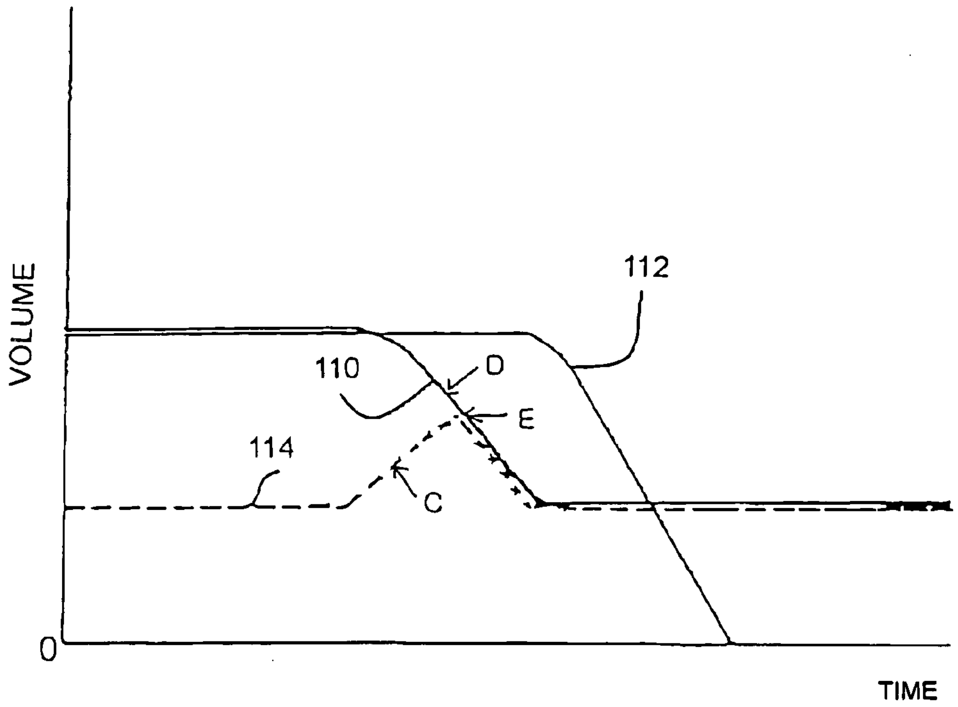
FIG. 5 is a diagram showing changes of volume level.
Figure 6:
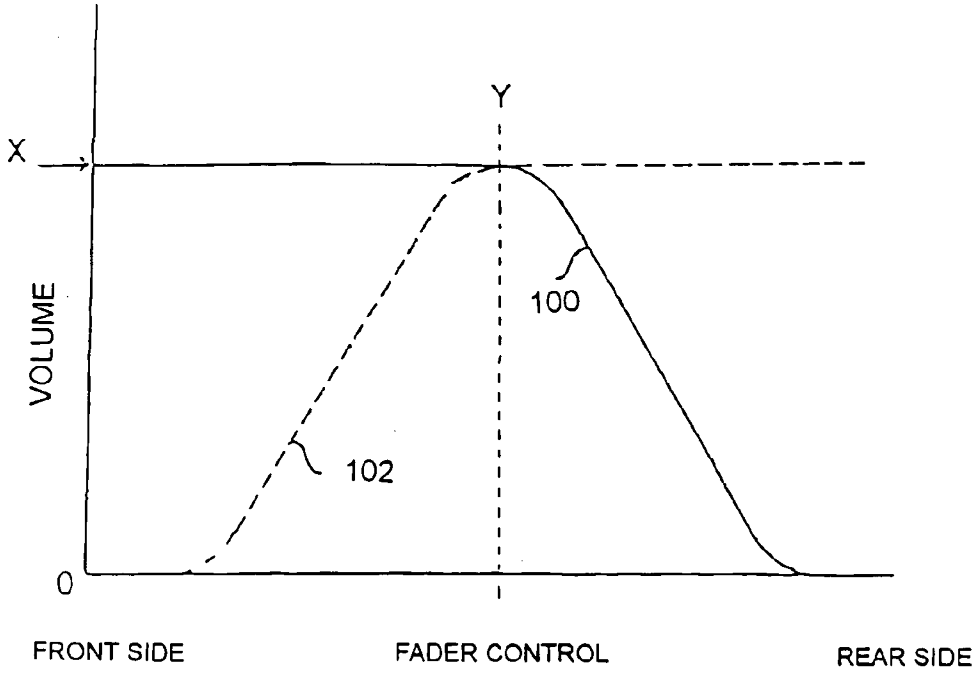
Fig. 6 Conventional Art
FIG. 6 is a diagram showing an operating characteristic of an electronic volume controller used in a conventional acoustic apparatus.
Figure 7:
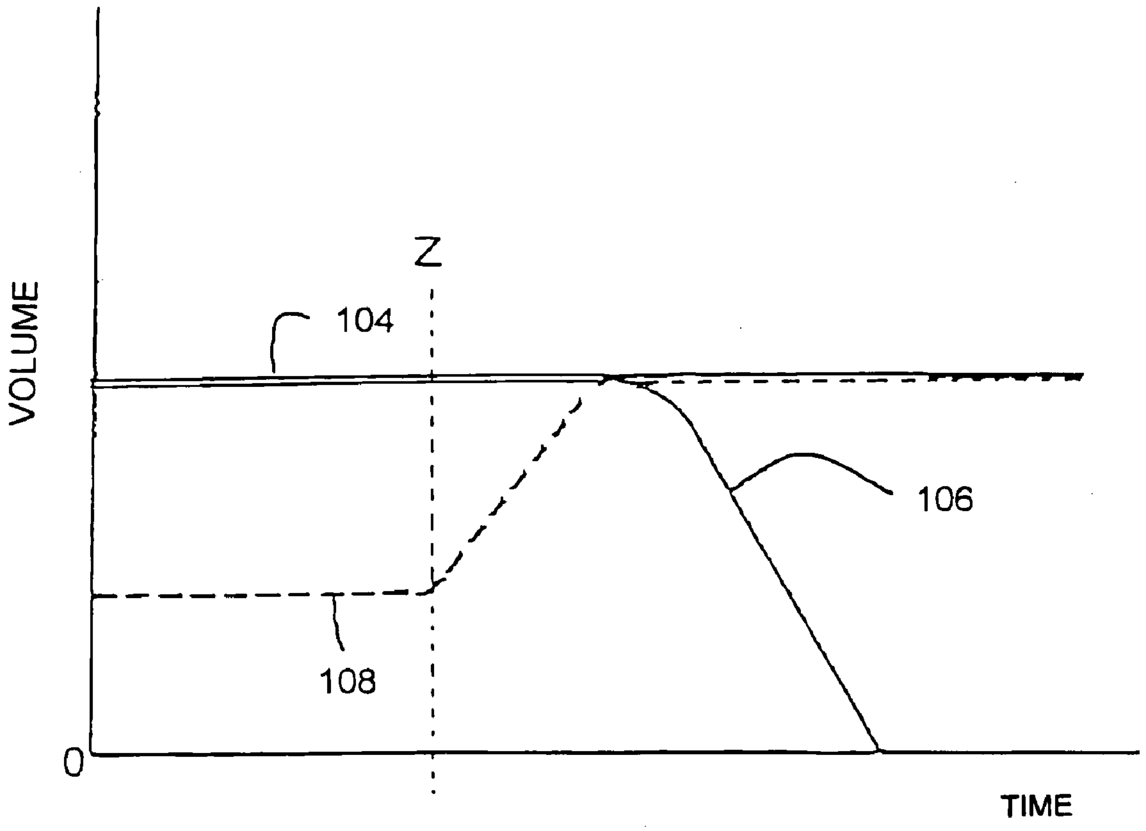
Fig. 7 Conventional Art
FIG. 7 is a diagram showing an example of changing volume levels in a conventional acoustic apparatus.

Next, the control operation of the microcomputer 25 in the embodiment of the invention is explained by referring to FIG. 4 and FIG. 5. FIG. 4 shows an example of flow of control operation started in a state where the volume level of the rear speakers are attenuated by a specified amount, and it is preliminarily stored as an operation program in a storage unit (not shown) in the microcomputer 25. FIG. 5 shows how the volume level of front speakers, the volume level of rear speakers, and the main volume level changes during the execution of this operation program.

At step S1, the microcomputer 25 reads out the data stored in the RAM 26, varies the resistance values of the variable resistors in the volume control unit 10*a*, the fader 10*b* and the fader B 10*c*, and sets the main volume level, the volume level of the front speakers, and the volume level of the rear speakers according to the data thus read out.

At step S2, it is judged if the control buttons 21*a* and 21*b* are manipulated or not on the basis of the electric signals supplied from the volume control button 21*a* and the balance control button 21*b*. If it is judged that the button is manipulated (step S2;YES), the process goes to step S3.

If the volume control button 21*a* has been turned by the user in step S2, on the basis of the electric signal Sa supplied from the volume control button 21*a*, the control signal Va is sent out to the volume control unit 10*a* to adjust the main volume level, and the data indicating the volume level is stored in the RAM 26.

If the balance control button 21*b* has been turned clockwise in FIG. 2 by the user, on the basis of the electric signal Sb supplied from the balance control button 21*b*, the control signal F is sent out to vary the resistance values of the variable resistor 10*b*21 of fader 10*b* and the variable resistor 10*c*21 of fader 10*c*, and the data indicating the attenuation amount is stored in the RAM 26.

On the other hand, if the balance control button 21*b* has been turned counterclockwise in FIG. 2 by the user, on the basis of the electric signal Sb supplied from the balance control button 21*b*, the control signal F is sent out to vary the resistance values of the variable resistor 10*b*11 of fader 10*b* and the variable resistor 10*c*11 of fader B 10*c*, and the data indicating the attenuation amount is stored in the RAM 26. Then, the process goes back to step S1, and the operation following step S1 is executed.

If any button has not been manipulated at step S2, the process goes to step S4. At step S4, the microcomputer 25 judges whether or not the external audio signals GL and GR are supplied from the external device to the front speakers FL and FR, that is, whether or not the supply signal Gy is received from the external device 28. If the supply signal Gy is not received (step S4;NO), the process goes to step S1, the operation following step S1 is executed. If it is judged at step S4 that the supply signal Gy is received from the external device 28 (step S4;YES), the process goes to step S5.

At step S5, the microcomputer 25 controls the fader 10*b* and fader 10*c* to attenuate the volume level of the front speakers to the minimum level At this time, the fader 10*b* and fader 10*c* vary the resistance values of the variable resistors 10*b*21 and 10*c*21 to the value corresponding to the main volume level on the basis of the control signal F from the microcomputer 25.

At step S6 the microcomputer 25 controls the fader 10*b* and fader 10*c*, and simultaneously reads out the data showing the attenuation amount of the volume level of the rear speakers from the RAM 26, and controls the volume control unit 10*a* to attenuate the main volume level by force to the attenuation amount thus readout. The volume control unit 10*a* varies the resistance values of the variable resistors 10*a*1 and 10*a*2 on the basis of the control signal Va from the microcomputer 25.

Then, the fader 10*b* and the fader 10*c* vary the variable resistors 10*b*21 and 10*c*21 to the attenuated main volume value, and vary the resistance values of the variable resistors 10*b*11 and 10*c*11 to attenuate the volume level of the front speakers to the minimum level.

By the process at step 5S and step S6, the main volume level, the volume level of front speakers, and the volume level of rear speakers changes as shown in FIG. 5. In FIG. 5, the graph 110 shows the main volume level adjusted by the volume control unit 10*a*, the graph 112 shows the volume level of front speakers FL and FR, and the graph 114 shows the volume level of the rear speakers RL and RR attenuated by a specified amount.

As is clear from FIG. 5, in order to localize the sound image created by the output audio signals at the center, the volume level of the rear speakers attenuated by a specified amount once increases toward the main volume level as indicated by the arrow C, but the main volume level is attenuated at the same time as shown by the arrow D. Therefore, when the main volume level and the volume level of the rear speaker becomes equal to each other at the point shown by the arrow E, the volume level of the rear speaker shown by the graph 114 decreases according to the decrease of the main volume level and eventually both level shown by the graphs 110 and 114 reach and stay at the initial specified attenuated level After the volume level of the rear speakers reach the specified attenuated level due to the attenuated main volume level, the volume level of the front speakers is attenuated to the minimum level as shown by the graph 112.

After the volume level of the front speakers has been attenuated to the minimum level, at step S7, it is judged whether the supply signal Gy is still being supplied from the external device 28 or not, and if the supply signal Gy is obtained (step S7;YES), the supply of supply signal Gy is monitored continuously.

If supply signal Gy is not obtained from the external device 28 (step S7; NO), that is, it is judged that the supply of the external audio signals GL and GR to the front speakers FL and FR from the external device is terminated, the process goes to step S8 At step SE, the data stored in the RAM 26 is read out, and the main volume level, the volume level of front speakers, and the volume level of rear speakers are set on the basis of the read-out data Thus, the value levels of the front and read speakers return to the level before the external audio signal is inputted. Then, the process goes to step S1, and the operation following step S1 is executed.

In the car-mount acoustic apparatus 100 of the embodiment as described above, if the audio information from the external device 28 such as a navigation system is supplied to the front speakers FL and FR as interrupt information, since the main volume level is attenuated to the volume level of the rear speakers, attraction of the listening sense of the user to the rear side is suppressed as much as possible, so that the user can correctly hear the audio information from the external device 28 from the front speakers FL and FR.

In the above embodiment, the microcomputer 25 judges that the external audio signals GL and GR to the front speakers FL and FR from the external device 28, by the start signal Gy from the external device 28. However, it may be configured to judge presence or absence of supply of the audio signals GL and GR by monitoring the connection lines between the external device 28 and the front speakers FL and FR.

The audio signals GL and GR from the external device 28 are directly supplied to the front speakers FL and FR in the above embodiment. However, they may be supplied through the power amplifier 20.

In the above embodiment, when the audio signals are supplied from the external device 28, the microcomputer 25 controls the fader 10*b* and the fader 10*c* to attenuate the volume level of the front speakers automatically to the minimum level. However, for example, a mute button may be provided in the operation panel 27 to attenuate the volume level to the minimum level, and after confirming that the mute button is pressed by the user, the volume level of the front speakers may be attenuated to the minimum level.

In the embodiment, the external device 28 is connected to the front speakers FL and FR, but the same effects are obtained if the external device 28 is connected to the rear speakers RL and RR. At this time, in a state where the volume level of the front speakers is attenuated by a specified amount, if the audio signals from the external device 28 are supplied to the rear speakers RL and RR, by controlling the volume control unit 10*a* to attenuate the main volume level to the volume level of the front speakers, attraction of the listening sense of the user to the front side is suppressed as much as possible. By this, the user can correctly hear the audio information from the external device 28 from the rear speakers RL and RR.

The embodiment of the invention described herein is an example of car-mount acoustic apparatus, but the application of the present invention is not limited to this. Namely, the present invention may also be applied, for example, to an acoustic apparatus for creating a sound field in a home theater in a household.

The invention is not particularly limited as far as the acoustic apparatus includes front speakers installed at the front side in a room and rear speakers installed at the rear side, with either one of the speakers designed to deliver audio information from an external device, and not limited to the illustrated embodiment of a car-mount acoustic apparatus. The present invention may be applied to various uses so far as not departing from the true spirit and scope of the invention.

According to the invention, if audio information from the external device is supplied as interrupt information, the volume level of audio signals is attenuated to the attenuated volume level of the front speakers or rear speakers. Therefore, it is possible to suppress that attraction of the listening sense of the user is shifted due to the shift of the sound image created by the audio signals, and the external audio information from the external device can be correctly heard by the user.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2000-386218 filed on Dec. 20, 2000 including the specification, claims, drawings and summary is incorporated herein by reference in its entirety.

What is claimed is:

1. An acoustic apparatus comprising:

one or more front speakers disposed at a front side in a space for outputting a first audio signal;

one or more rear speakers disposed at a rear side in the space for outputting a second audio signal;

a volume control device for controlling main volume levels of the first audio signal and the second audio signal;

a balance control device for attenuating one of a first volume level indicating volume level of the first audio signal and a second volume level indicating volume level of the second audio signal from the main volume level and for increasing the other one of the first volume level and the second volume level to be at the main volume level, from a state in which the one of the first volume level and the second volume level is set to the main volume level and the other one of the first volume level and the second volume level is attenuated from the main volume level; and a control device, wherein, in the state in which the one of the first volume level and the second volume level is set to the main volume level and the other one of the first volume level and the second volume level is attenuated from the main volume level, when an external audio signal is supplied to the speaker or speakers outputting the audio signal corresponding to the one of the first volume level and the second volume level, the control device controls the balance control device to increase the other one of the first volume level and the second volume level and simultaneously controls the volume control device to attenuate the main volume level by a predetermined amount.

2. An apparatus according to claim 1, wherein the other one of the first volume level and the second volume level is attenuated from the main volume level to a minimum level.

3. An apparatus according to claim 2, wherein the minimum level comprises a zero level.

4. An apparatus according to claim 2, further comprising a mute instruction unit for detecting a mute instruction inputted by a user, wherein the control device controls the volume control device to attenuate the volume levels of the audio signals when the mute instruction is detected by the mute instruction unit.

5. An apparatus according to claim 1, wherein the volume control device sets the volume levels of the first audio signal and the second audio signal to the volume levels before the external audio signal is supplied, when supply of the external audio signal ends.

6. An apparatus according to claim 5, wherein the control device comprises:

a storage unit for storing the volume levels of the first audio signal and the second audio signal before the external audio signal is inputted;

a readout unit for reading out the volume levels stored in the storage unit when the supply of the external audio signal ends; and a changing unit for changing the volume levels of the first audio signal and the second audio signal to be the volume levels readout by the readout unit.

7. An apparatus according to claim 1, wherein the control device detects a supply of the external audio signal by receiving a signal indicating the supply of the external audio signal.

8. An apparatus according to claim 1, wherein the control device detects a supply of the external audio signal by monitoring the external audio signal supplied to the speaker.

9. An apparatus according to claim 1, wherein the control device attenuates the volume levels of the first and the second audio signals to the volume level of the other one of the front speaker and the rear speaker to which the external audio signal is not supplied.

* * * * *